United States Patent
Pranatharthiharan et al.

(10) Patent No.: US 9,530,890 B1
(45) Date of Patent: Dec. 27, 2016

(54) PARASITIC CAPACITANCE REDUCTION

(71) Applicant: International Business Machines Corporation, Armonk, NY (US)

(72) Inventors: Balasubramanian Pranatharthiharan, Watervliet, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/929,770

(22) Filed: Nov. 2, 2015

(51) Int. Cl.
*H01L 29/66* (2006.01)
*H01L 29/78* (2006.01)

(52) U.S. Cl.
CPC ......... *H01L 29/785* (2013.01); *H01L 29/6656* (2013.01); *H01L 29/66545* (2013.01); *H01L 29/66795* (2013.01)

(58) Field of Classification Search
CPC ............. H01L 29/785; H01L 29/66545; H01L 29/6656; H01L 29/66795
See application file for complete search history.

(56) References Cited

U.S. PATENT DOCUMENTS

| | | | |
|---|---|---|---|
| 6,713,357 B1 | 3/2004 | Wang et al. | |
| 6,720,213 B1 | 4/2004 | Gambino et al. | |
| 6,885,055 B2 | 4/2005 | Lee | |
| 6,987,289 B2 | 1/2006 | Nowak | |
| 7,569,897 B2 | 8/2009 | Anderson et al. | |
| 8,030,709 B2 | 10/2011 | Adams et al. | |
| 8,362,572 B2 | 1/2013 | Huang et al. | |
| 8,637,384 B2 | 1/2014 | Ando et al. | |
| 8,809,962 B2 | 8/2014 | Liu et al. | |
| 9,026,975 B2 | 5/2015 | Song et al. | |
| 2008/0258234 A1* | 10/2008 | Henson | H01L 21/28097 257/384 |
| 2012/0058639 A1* | 3/2012 | Sim | H01L 21/7682 438/666 |
| 2012/0061763 A1* | 3/2012 | Lee | H01L 21/764 257/365 |
| 2013/0292835 A1* | 11/2013 | King | H01L 21/02178 257/741 |
| 2014/0024192 A1* | 1/2014 | Kim | H01L 29/6653 438/296 |
| 2014/0225219 A1 | 8/2014 | Huang et al. | |
| 2014/0306274 A1 | 10/2014 | Basker et al. | |
| 2015/0214113 A1* | 7/2015 | Bouche | H01L 21/82343 438/283 |
| 2015/0255561 A1* | 9/2015 | Cai | H01L 29/78 257/411 |
| 2015/0311112 A1* | 10/2015 | Fukuo | H01L 21/76802 257/773 |

* cited by examiner

*Primary Examiner* — Nicholas Tobergte
(74) *Attorney, Agent, or Firm* — Cantor Colburn LLP; Vazken Alexanian

(57) ABSTRACT

A method of making a semiconductor device includes forming a gate on a substrate; removing an end portion of the gate to form a recess at an end of the gate; depositing a low-k material in the recess such that an air gap is formed in the low-k material; removing a portion of the low-k material; depositing an insulating material on the low-k material that was recessed to form a bilayer insulating stack; and forming a source/drain contact on an active area positioned on the substrate and alongside the gate.

6 Claims, 16 Drawing Sheets

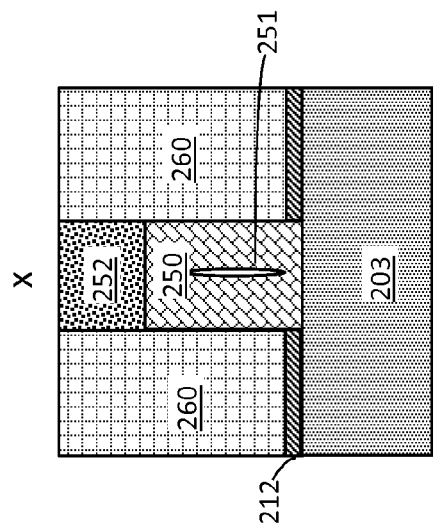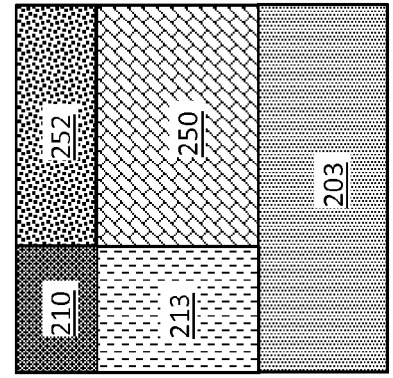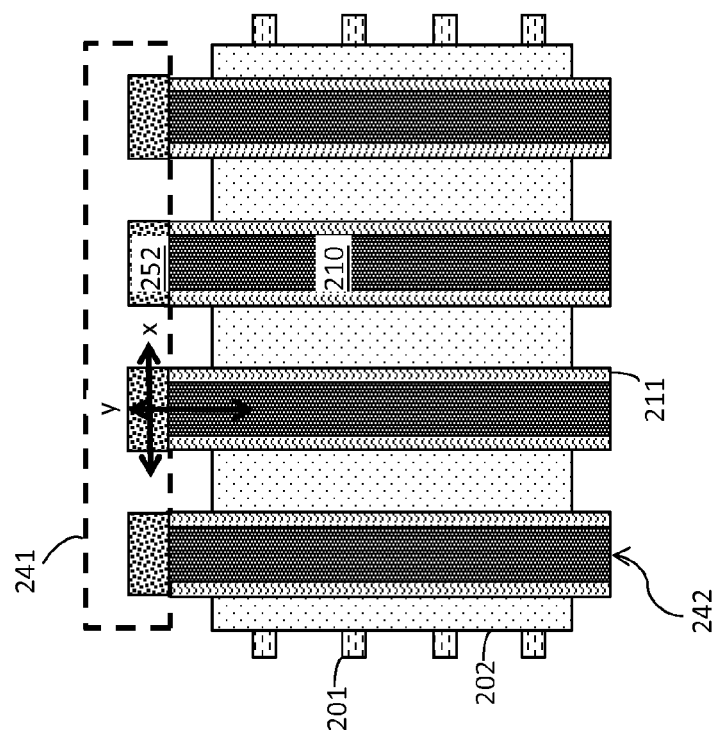

PARASITIC CAPACITANCE REDUCTION

BACKGROUND

The present invention relates to metal-oxide-semiconductor field-effect transistors (MOSFET), and more specifically, to fin-type field-effect transistors (FinFET).

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

The FinFET is a type of MOSFET. The FinFET is a double-gate silicon-on-insulator (SOI) device that mitigates the effects of short channels and reduces drain-induced barrier lowering. The "fin" refers to the narrow channel between source and drain regions. A thin insulating oxide layer on either side of the fin separates the fin from the gate.

SUMMARY

According to an embodiment, a method of making a semiconductor device includes forming a gate on a substrate; removing an end portion of the gate to form a recess at an end of the gate; depositing a low-k material in the recess such that an air gap is formed in the low-k material; removing a portion of the low-k material; depositing an insulating material on the low-k material that was recessed to form a bilayer insulating stack; and forming a source/drain contact on an active area positioned on the substrate and alongside the gate.

According to another embodiment, a method of making a semiconductor device includes forming a gate on a substrate, the gate including a sacrificial material and a hard mask disposed on the sacrificial material; removing an end portion of the gate to form a recess at an end of the gate; depositing a low-k material in the recess; removing the sacrificial material and the hard mask from remaining portions of the gate; replacing the sacrificial material with a metal gate stack; removing a portion of the low-k material in the recess at the end of the gate; depositing an insulating layer on the low-k material and the metal gate stack; and forming a source/drain contact on an active area positioned on the substrate and alongside the gate.

Yet, according to another embodiment, a semiconductor device includes a substrate including an active area; a gate disposed on the substrate, a gate spacer positioned on a sidewall of the gate; a gate hard mask positioned on a surface of the gate; a bilayer insulating stack disposed on the substrate at an end of the gate, the bilayer insulating stack including a low-k material in contact with the substrate and an insulating layer disposed on the low-k material; and a source/drain contact positioned on the active area of the substrate and adjacent to the gate.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 2A-2C illustrate semiconductor devices according to various embodiments, in which:

FIG. 2A is a top view;

FIG. 2B is a cross-sectional side view through the x-axis of FIG. 2A;

FIG. 2C is a cross-sectional side view through the y-axis of FIG. 2A;

FIGS. 3A-11C illustrate methods of making semiconductor devices according to a first embodiment, in which;

FIG. 3A is a top view of active areas between gates;

FIG. 10A is a top view after depositing an insulating material on the recessed gate;

FIG. 10B is a cross-sectional side view through the x-axis of FIG. 10A;

FIG. 10C is a cross-sectional side view through the y-axis of FIG. 10A;

FIG. 11C is a cross-sectional side view through the y-axis of FIG. 11A;

FIGS. 12A-16C illustrate methods of making semiconductor devices according to a second embodiment, in which:

FIG. 12A is a top view after etching the gate, hard mask, and spacer and depositing a low-k material following FIG. 5A;

FIG. 16C is a cross-sectional side view through the y-axis of FIG. 16A.

DETAILED DESCRIPTION

Silicon nitride positioned on a gate end after the gate is cut may avoid gate to source/drain contact electrical shorting. However, the silicon nitride may increase the gate to source/drain contact parasitic capacitance.

Figure 1:
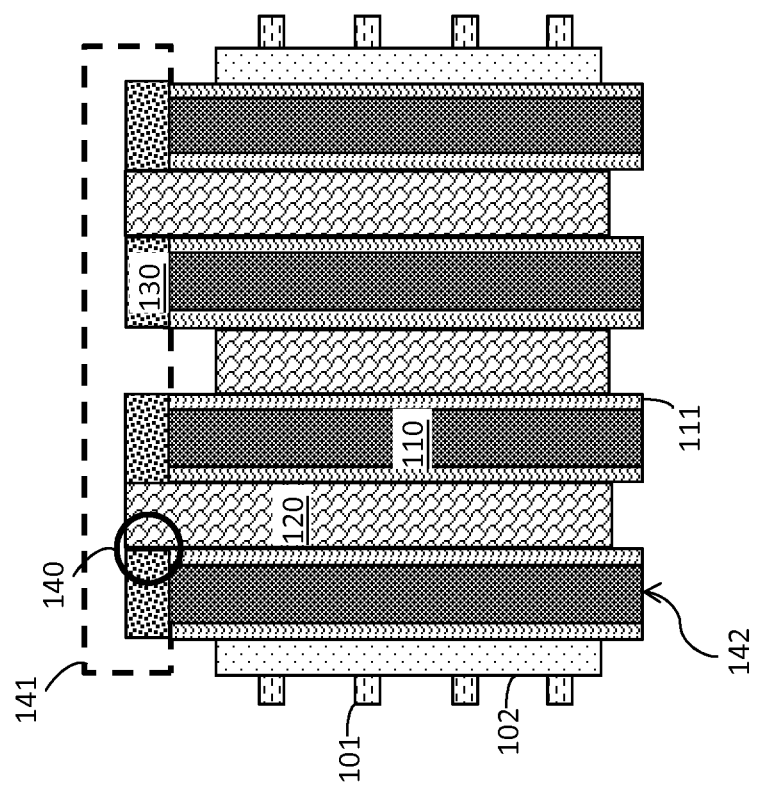
FIG. 1 illustrates a top view of a semiconductor device with a silicon nitride end that may increase the gate to contact parasitic capacitance.

For example, FIG. 1 illustrates a top view of semiconductor device with a silicon nitride end that may increase the gate to contact parasitic capacitance. Fins 101 are patterned in a substrate. Gates 142 including a hard mask 110 (gate cap) are formed on the fins 101. A gate spacer 111 is positioned along a sidewall of the gates 142. Active areas 102 (source/drain and channel regions) are formed between and under the gates 142. An interlayer dielectric (ILD), which is not shown for clarity, is disposed on and around the gates 142. A portion of the ILD is removed above the ends of the gates 142 in the region 141. The gate ends in the region 141 are removed. A silicon nitride layer 130 is deposited to fill the gate ends. Source/drain contacts 120 are positioned between the gates 142.

Although the silicon nitride layer 130 at the gate ends may reduce electrical shorting between the gate 142 and the source/drain contact 120, the silicon nitride layer 130 may increase the gate 142 to source/drain contact 120 parasitic capacitance (in region 140).

Accordingly, various embodiments provide semiconductor devices and methods of making semiconductor devices that reduce the gate end parasitic capacitance. In some embodiments, a low-k material (e.g., less than the k of silicon nitride) is deposited on the gate end to reduce the capacitance, and a silicon nitride cap/layer is deposited on the low-k material to protect the low-k material during process integration. The methods allow for a robust self-aligned contact etching process. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 2B:
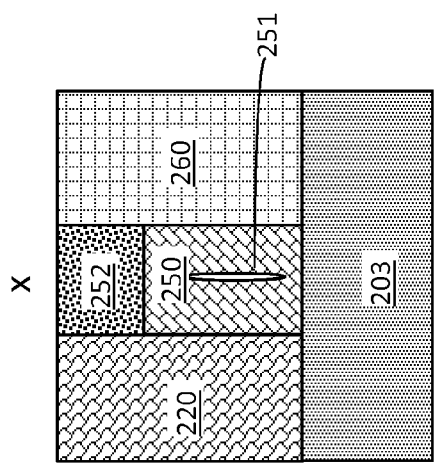
Figure 2C:
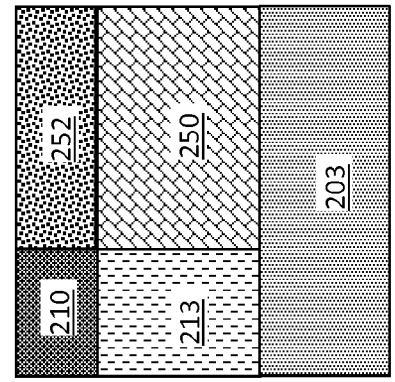
Figure 2A:
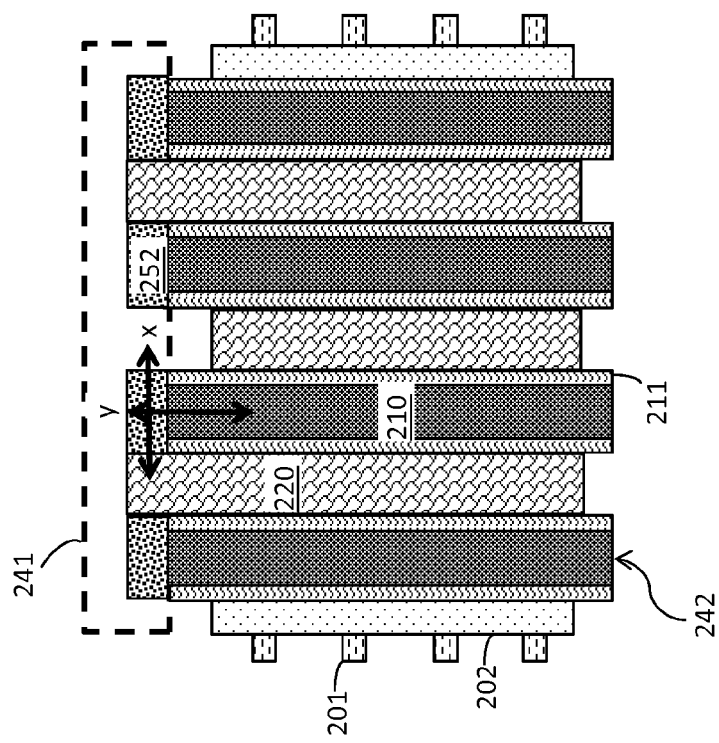

Turning again to the Figures, FIGS. 2A-2C illustrate semiconductor devices according to various embodiments. FIG. 2A is a top view. FIG. 2B is a cross-sectional side view through the x-axis of FIG. 2A. FIG. 2C is a cross-sectional side view through the y-axis of FIG. 2A. FIGS. 2A-2C are described in further detail below in FIGS. 3A-11C and 12A-16C, which illustrate first and second embodiments, respectively.

Fins 201 are patterned in a substrate. The substrate includes STI regions 203, which are isolation regions formed by etching trenches in the substrate and then filling the trenches with a dielectric material.

Gates 242 that include a hard mask 210 (gate cap) and gate stack 213 are formed on the fins 201. A gate spacer 211 is positioned along a sidewall of the gates 242. Active areas 202 (source/drain and channel regions) are formed between and under the gates 242. An ILD 260 is disposed on and around the gates 242. For clarity, the ILD 260 is not shown in FIG. 2A. A portion of the ILD 260 is removed above the ends of the gates 242 in the region 241. The gate ends in the region 241 are removed, for example, by etching.

A low-k material 250 is disposed on the gate end region 241. An air gap 251 forms in the low k material 250 (FIG. 2B). An insulating material 252 is disposed on the low-k material 250. Source/drain contacts 220 are formed between the gates 242. The bilayer insulating stack, including the low-k material 250 and the insulating material 252, reduces gate end parasitic capacitance.

Figure 3B:
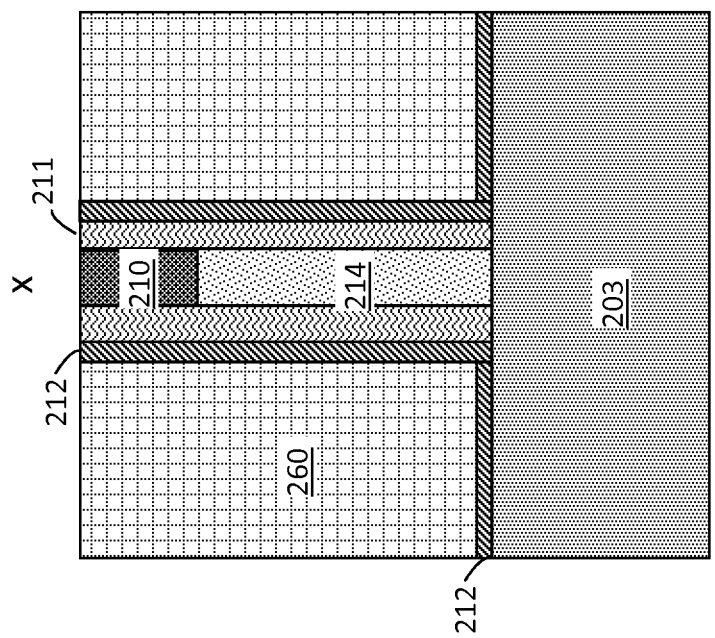
FIG. 3B is a cross-sectional side view through the x-axis of FIG. 3A.
Figure 3A:
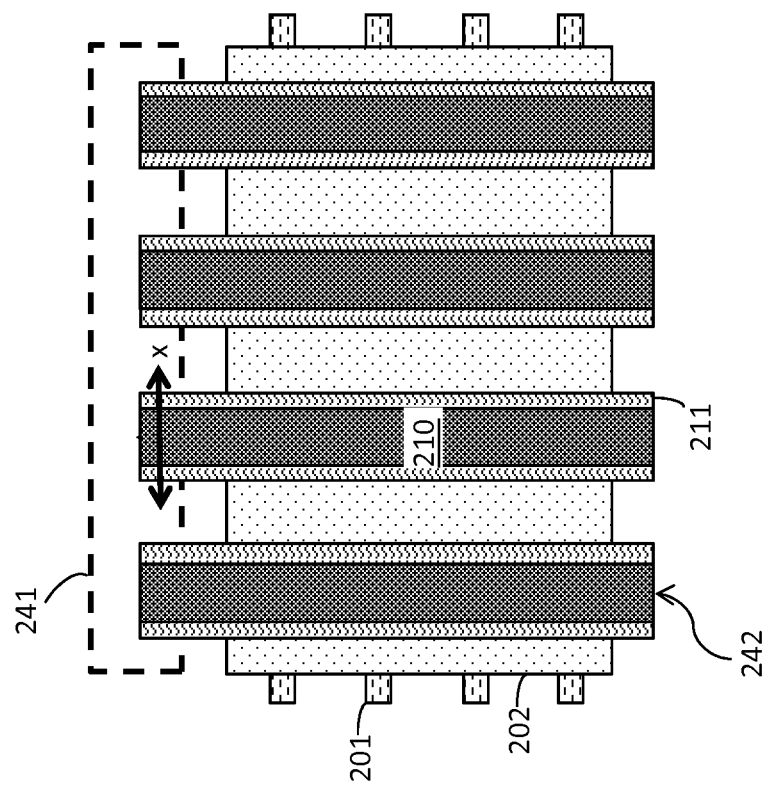

FIGS. 3A-11C illustrate methods of making semiconductor devices according to the first embodiment. FIG. 3A is a top view of active areas 202 between gates 242. FIG. 3B is a cross-sectional side view through the x-axis of FIG. 3A.

Fins 201 are patterned in a substrate. The fins 201 may be formed in the substrate by, for example, depositing a hard mask material on the substrate, patterning the hard mask material by, for example, sidewall imaging transfer, and etching the hard mask material and the substrate material to form the fins 201.

Non-limiting examples of substrate materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof.

A STI process is performed to form the STI regions 203 (FIG. 3B) in the substrate around the fins 201. The STI regions 203 are isolation regions formed by etching trenches in the substrate and then filling the trenches with at least one dielectric material. Non-limiting examples of suitable dielectric materials for the STI regions 203 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof.

Gates 242 are filled with a sacrificial gate material 214 to form "dummy" gates. The sacrificial gate material 214 may be, for example, amorphous silicon (aSi) or polycrystalline silicon (polysilicon). The sacrificial gate material 214 may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

An insulating hard mask 210 for example, silicon nitride (SiN), SiOCN, or SiBCN, is deposited on the sacrificial gate material 214 to form a gate cap. The hard mask 210 may be deposited using a deposition process, including, but not limited to, PVD, CVD, PECVD, or any combination thereof. The sacrificial gate material 214 and the hard mask 210 are patterned and etched. For example, a photoresist (not shown) may be patterned by exposure to a desired pattern of radiation. Then the exposed photoresist is developed and with a resist developer to provide a patterned photoresist over the hard mask 210. The photoresist pattern is transferred through the hard mask 210 and sacrificial gate material 214 by performing an etching process. Then the photoresist is removed. Any other suitable patterning technique (e.g., sidewall imaging transfer) may also be used to pattern the dummy gates.

To form spacers 211, an insulating and/or low-k spacer material, for example, silicon dioxide ($SiO_2$), silicon nitride ($Si_3N_4$), SiOCN, or SiBCN, is deposited over the hard mask 210 and sacrificial gate material 214. An anisotropic etching process, for example, reactive ion etching (RIE), is performed to form spacers 211 positioned along a sidewall of the gates 242.

Optionally, a dielectric material layer 212 may be deposited on the substrate and STI regions 203 and along sidewalls of the spacers 211. The dielectric material layer 212 may include, e.g., silicon oxide, silicon oxynitride, or silicon nitride.

Active areas 202 (source/drain and channel regions) are formed between and under the gates 242. The active areas 202 may be formed by performing an epitaxial growth process to deposit a crystalline layer onto the crystalline substrate beneath. Alternatively, the active areas 202 also may be formed by incorporating dopants into the substrate.

Epitaxial layers may be grown using, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The epitaxial silicon, silicon germanium, and/or carbon doped silicon (Si:C) silicon may be doped during deposition by adding a dopant or impurity to form a silicide.

An ILD 260 is disposed on and around the gates 242. For clarity, the ILD 260 is not shown in FIG. 3A. The ILD 260 may include a low-k dielectric material (with k<4.0), including but not limited to, silicon dioxide, spin-on-glass, a flowable oxide, a high density plasma oxide, borophosphosilicate glass (BPSG), or any combination thereof. The ILD 260 is formed by a deposition process, including, but not limited to CVD, PVD, plasma-enhanced CVD (PECVD), atomic layer deposition (ALD), evaporation, chemical solution deposition, or like processes. A planarization process, for example, chemical mechanical planarization (CMP), is performed to polish the surface of the ILD 260.

Figure 4B:
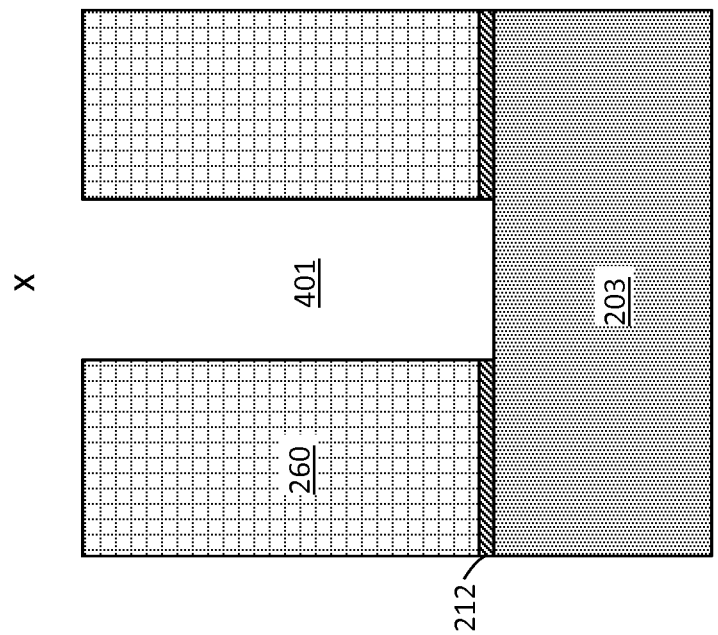
FIG. 4B is a cross-sectional side view after removing the gate and spacer to form a recess.
Figure 4A:
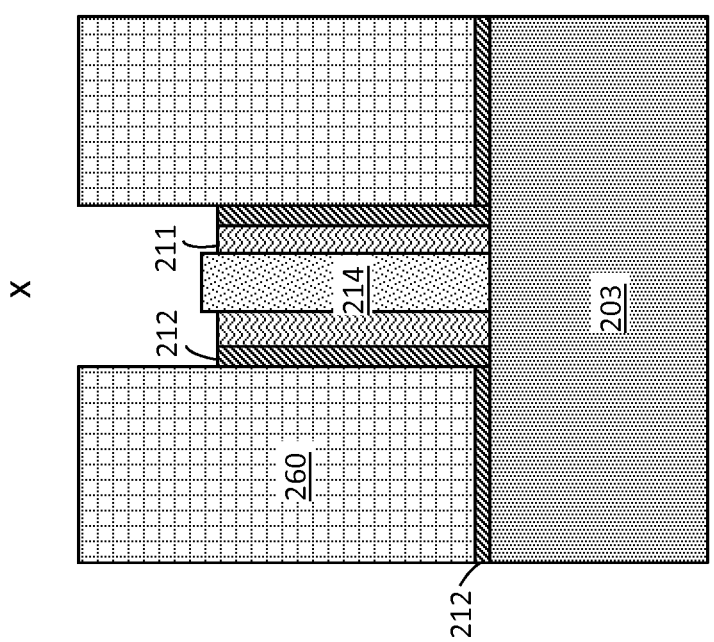
FIG. 4A is a cross-sectional side view after removing the gate hard mask.

FIG. 4A is a cross-sectional side view through the x-axis of FIG. 3A after removing the hard mask 210 and recessing the spacers 211 and the dielectric material layer 212, when present, from a recess at the end of the gates 242.

A portion of the ILD 260 over the ends of the gates 242 is removed, by for example, etching. The hard mask 210, spacers 211, and dielectric material layer 212 may then be etched (cut) using a dry etch process, for example, a reactive ion etch (RIE) process.

FIG. 4B is a cross-sectional side view after removing the sacrificial gate material 214, spacers 211, and dielectric material layer 212 to form a trench 401 within the ILD 260 and exposed the STI region 203 (substrate). The etch process may be a dry etch process, for example, a RIE process.

Figure 5B:
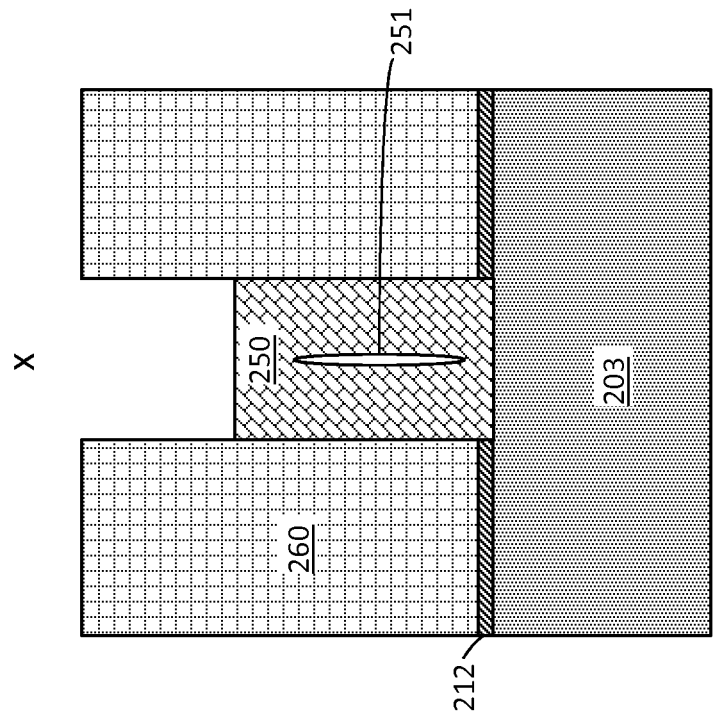
FIG. 5B is a cross-sectional side view after removing a portion of the low-k material.
Figure 5A:
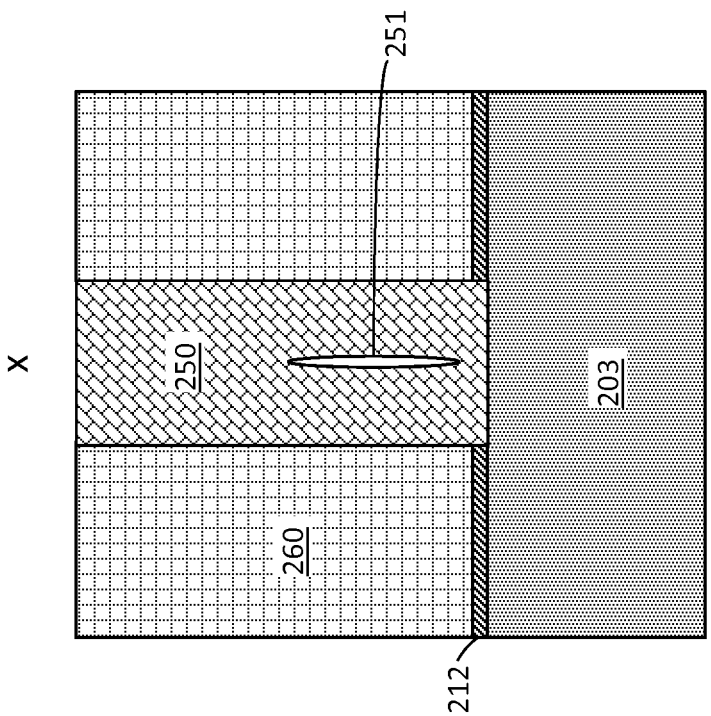
FIG. 5A is a cross-sectional side view after depositing a low-k material in the recess.

FIG. 5A is a cross-sectional side view after depositing a low-k material 250 in the trench 401. As the low-k material fills the trench 401, an air gap 251 (or seam) forms in the low k material 250. Both the low-k material 250 and the air gap 251 reduce parasitic capacitance at the gate ends. The air gap 251 reduces parasitic capacitance to an even greater extent than the low-k material 250.

The low-k material 250 may have a k of less than 5.5. Non-limiting examples of low-k materials 250 include silicon dioxide, spin-on-glass, a flowable oxide, a high density plasma oxide, borophosphosilicate glass (BPSG), SiBN, SiCN, SiBCN, or any combination thereof. The low-k material 250 may be deposited by a deposition process, including, but not limited to CVD, PVD, plasma-enhanced CVD, atomic layer deposition (ALD), evaporation, chemical solution deposition, or like processes.

FIG. 5B is a cross-sectional side view after removing a portion of the low-k material 250. The low-k material 250 may be removed by employing an etch process, for example, a dry etch process (e.g., RIE). At least 30 nanometers (nm) of the low-k material 250 is removed. In some embodiments, between about 30 and about 50 nm of the low-k material is removed.

Figure 6B:
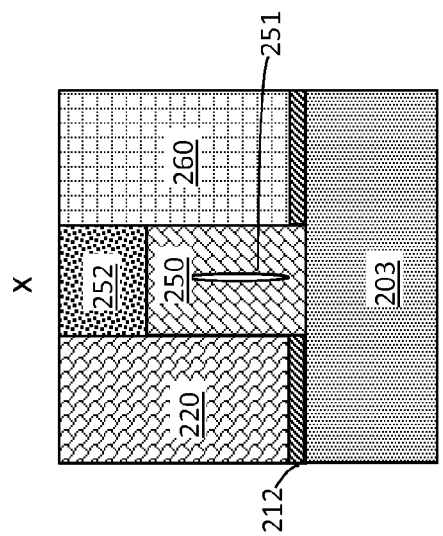
FIG. 6B is a cross-sectional side view through the x-axis of FIG. 6A.
Figure 6C:
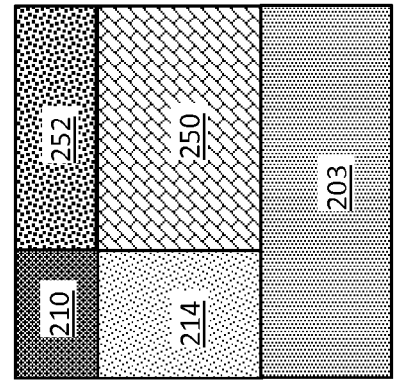
FIG. 6C is a cross-sectional side view through the y-axis of FIG. 6A.
Figure 6A:
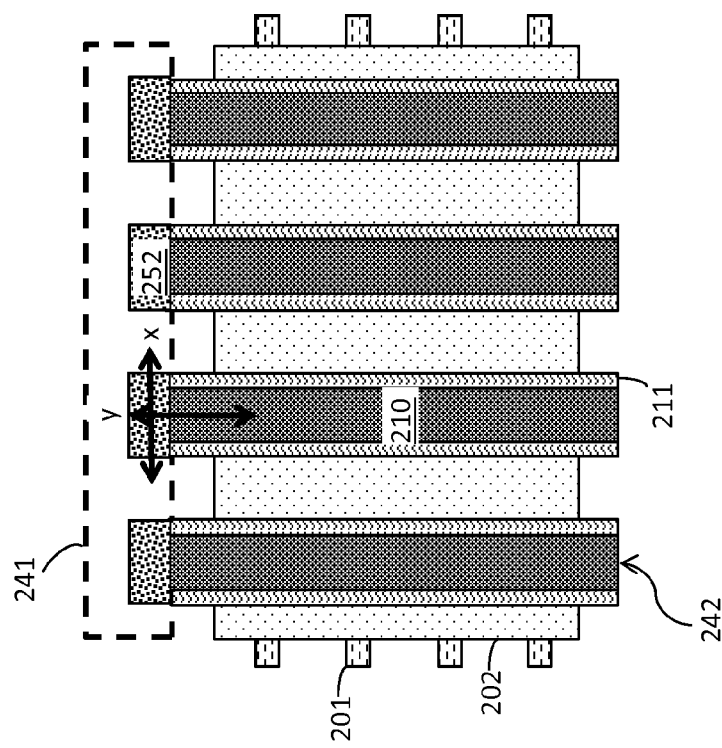
FIG. 6A is a top view view after depositing an insulating material on the low-k material.

FIG. 6A is a top view view after depositing an insulating material 252 on the low-k material 250. FIG. 6B is a cross-sectional side view through the x-axis of FIG. 6A. FIG. 6C is a cross-sectional side view through the y-axis of FIG. 6A.

The insulating material 252 protects the low-k material 250 during subsequent processing and forms a bilayer insulating stack. Non-limiting examples of materials for the insulating material 252 include silicon nitride, aluminum oxide, or any combination thereof. The insulating material 252 may be deposited using a suitable deposition process, including, but not limited to CVD, PVD, plasma enhanced CVD, atomic layer deposition (ALD), evaporation, chemical solution deposition, or like processes.

A planarization process, for example, CMP is performed to remove excess insulating material 252 on the surface of the ILD 260. The planarization process stops on the ILD 260.

In some embodiments, the insulating layer 252 and the hard mask 210 include silicon nitride. In other embodiments, the insulating layer 252 and the hard mask 210 include different materials.

Figure 7B:
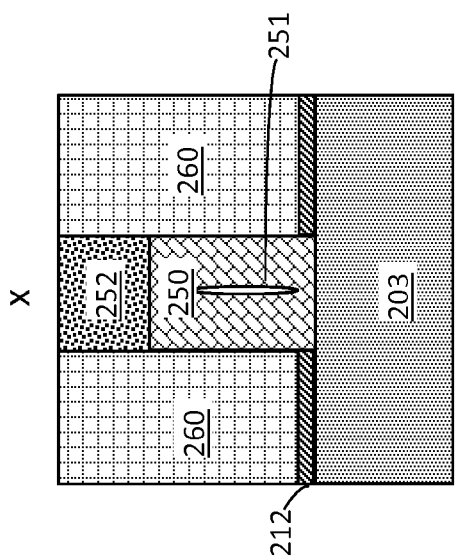
FIG. 7B is a cross-sectional side view through the x-axis of FIG. 7A.
Figure 7C:
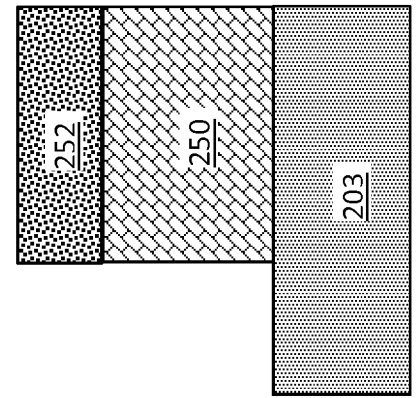
FIG. 7C is a cross-sectional side view through the y-axis of FIG. 7A.
Figure 7A:
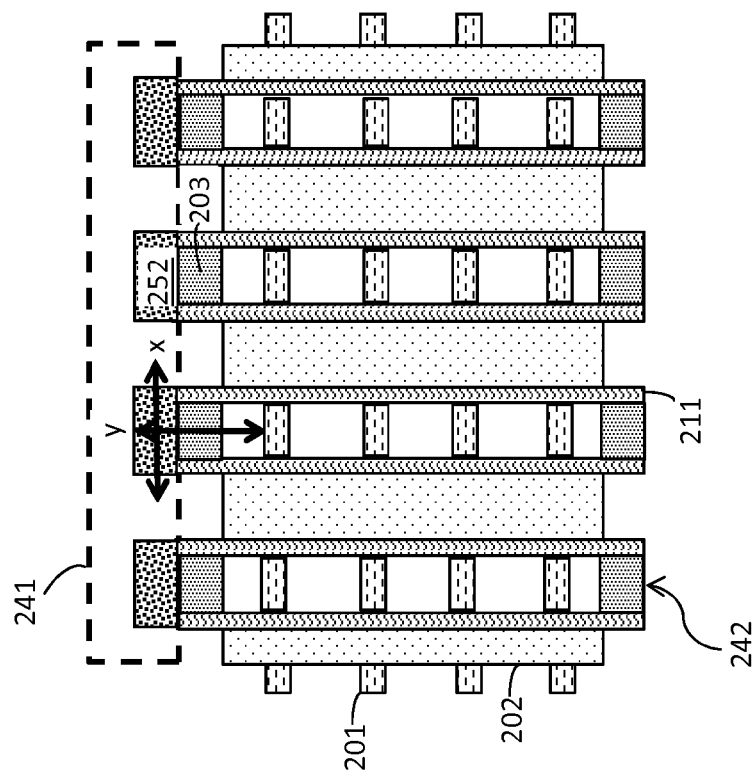
FIG. 7A is a top view after removing the sacrificial gate material.

FIG. 7A is a top view after removing the sacrificial gate material 214. FIG. 7B is a cross-sectional side view through the x-axis of FIG. 7A. FIG. 7C is a cross-sectional side view through the y-axis of FIG. 7A.

After removing the sacrificial gate material 214, STI regions 203, fins 201, and active areas 202 are exposed. The sacrificial gate material 214 may be removed by performing a dry etch process, for example, RIE, followed by a wet etch process. The wet etch process may include, for example, ammonia or tetramethylammonium hydroxide (TMAH).

Figure 8B:
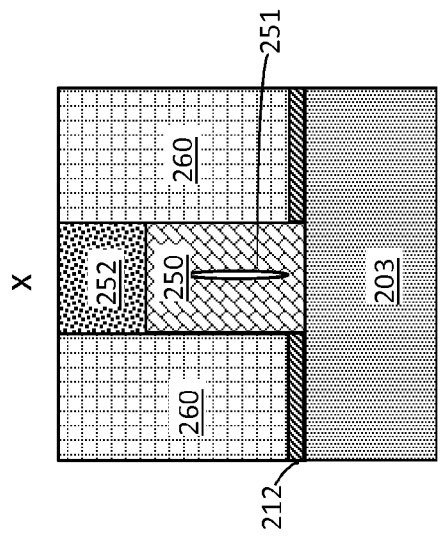
FIG. 8B is a cross-sectional side view through the x-axis of FIG. 8A.
Figure 8C:
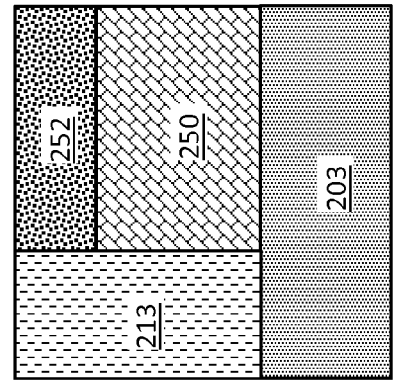
FIG. 8C is a cross-sectional side view through the y-axis of FIG. 8A.
Figure 8A:
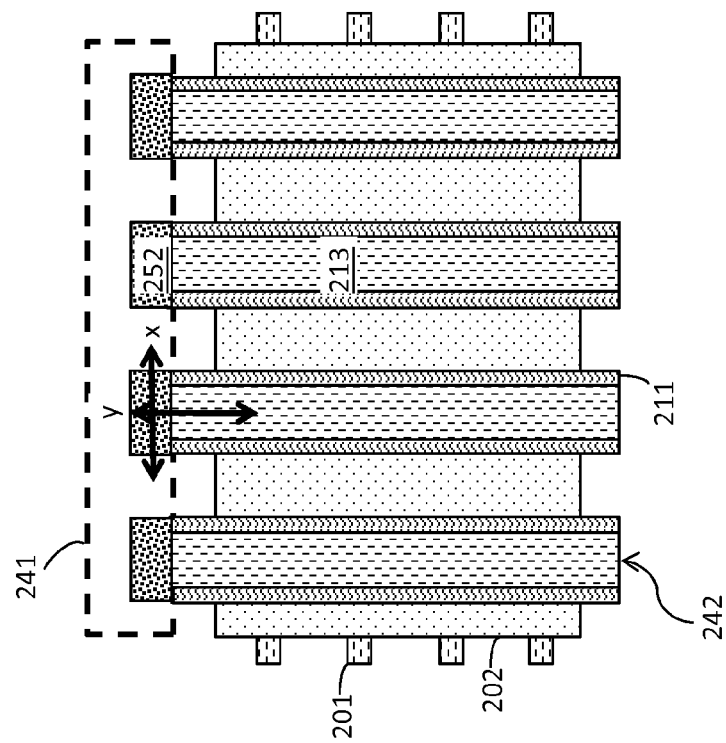
FIG. 8A is a top view after depositing a gate stack.

FIG. 8A is a top view after depositing a gate stack 213 to replace the sacrificial gate material 214 in remaining portions of the gate 242. FIG. 8B is a cross-sectional side view through the x-axis of FIG. 8A. FIG. 8C is a cross-sectional side view through the y-axis of FIG. 8A.

The gate stack 213 is a conductive gate stack and may include one or more dielectric materials, one or more workfunction metals, and one or more metal gate conductor materials. The gate dielectric material(s) can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The work function metal(s) may be disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

A conductive metal is deposited over the dielectric material(s) and workfunction layer(s) to form the gate stacks 213. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

Figure 9B:
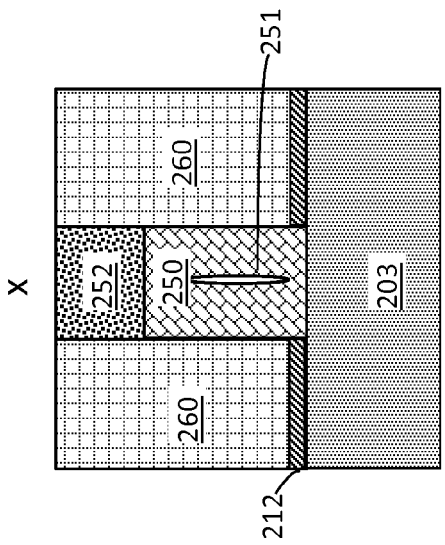
FIG. 9B is a cross-sectional side view through the x-axis of FIG. 9A.
Figure 9C:
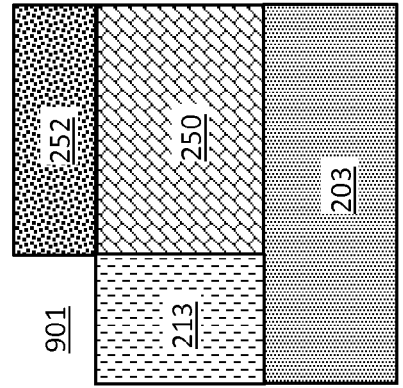
FIG. 9C is a cross-sectional side view through the y-axis of FIG. 9A.
Figure 9A:
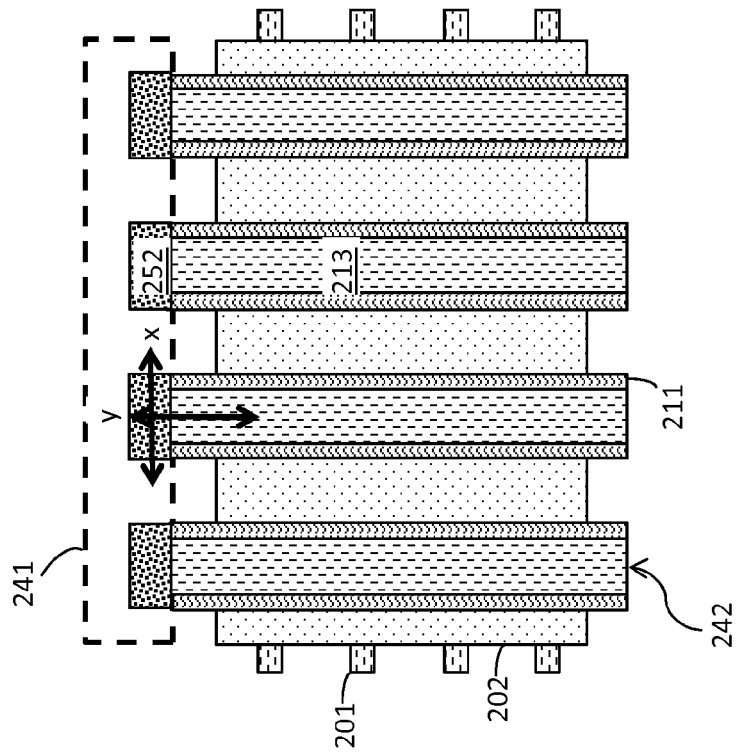
FIG. 9A is a top view after recessing the gate stack.

FIG. 9A is a top view after recessing the gate stack 213 to form a recess 901. FIG. 9B is a cross-sectional side view through the x-axis of FIG. 9A. FIG. 9C is a cross-sectional side view through the y-axis of FIG. 9A.

The gates stack 213 is recessed by performing a dry etch process, for example, a RIE process. The gate stack 213 is recessed down to about the level of the surface of the insulating material 252.

FIG. 10A is a top view after depositing a hard mask 210 material in the recess 901 on the recessed gate stack 213 to form gate caps. FIG. 10B is a cross-sectional side view through the x-axis of FIG. 10A. FIG. 10C is a cross-sectional side view through the y-axis of FIG. 10A.

The hard mask 210 is positioned in contact with the insulating material 252 of the bilayer stack at the end of the gate 242. The hard mask 210 may include an insulating material. The insulating material may be, for example, silicon nitride, aluminum oxide, or any combination thereof. The hard mask 210 may be formed using a suitable deposition process, including, but not limited to CVD, PVD, plasma enhanced CVD, atomic layer deposition (ALD), evaporation, chemical solution deposition, or like processes. A planarization process, for example, CMP, is performed to remove excess hard mask 210 material from the ILD 260.

Figure 11B:
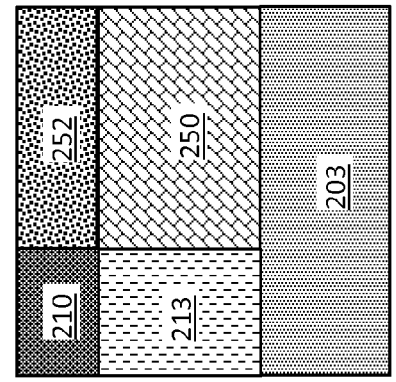
FIG. 11B is a cross-sectional side view through the x-axis of FIG. 11A.
Figure 11C:
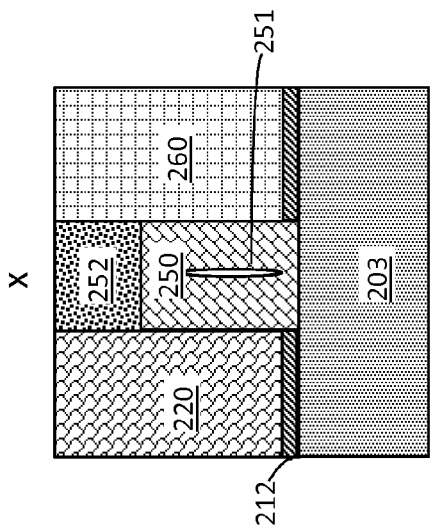
Figure 11A:
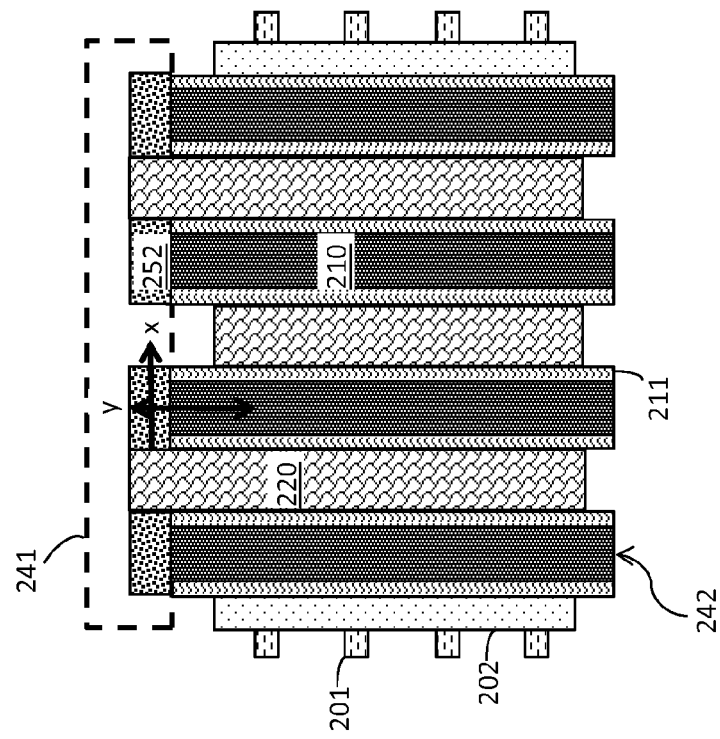
FIG. 11A is a top view after forming source/drain contacts on the active areas.

FIG. 11A is a top view after forming source/drain contacts 220 on the active areas 202 between the gates 242. FIG. 11B is a cross-sectional side view through the x-axis of FIG. 11A. FIG. 11C is a cross-sectional side view through the y-axis of FIG. 11A.

The source/drain contacts 220 are self-aligned contacts that are formed by removing a portion of the ILD 260 between (and adjacent to) the gates 242 down to the level of the active areas 202 to form contact trenches. The contact trenches may be formed by depositing a mask (not shown), for example, a photoresist, onthe ILD 260. The mask is patterned over the active areas 202. The pattern is transferred into the ILD 260 by removing the ILD 260 down to the level of active areas 202. The ILD 260 may be removed by a suitable etching process, for example, a RIE process. The mask can be removed after forming the contact trenches.

A low contact resistance liner, for example, including titanium and/or titanium nitride, may be deposited in the contact trenches. A conductive material is then disposed on the low contact resistance liner. The conductive material may include, but is not limited to, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 260.

Figure 12B:
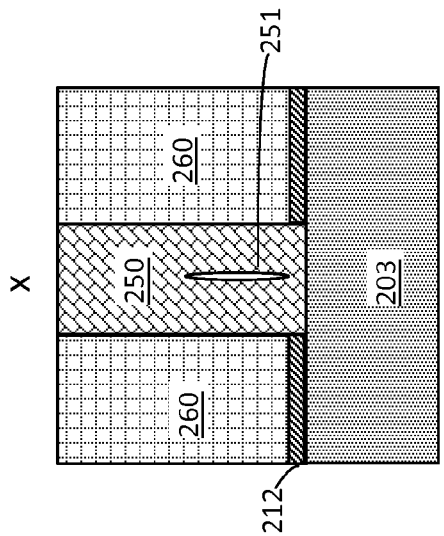
FIG. 12B is a cross-sectional side view through the x-axis of FIG. 12A.
Figure 12C:
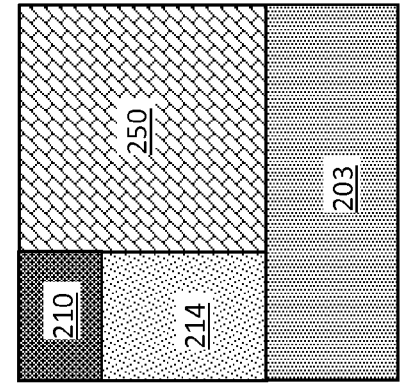
FIG. 12C is a cross-sectional side view through the y-axis of FIG. 12B.
Figure 12A:
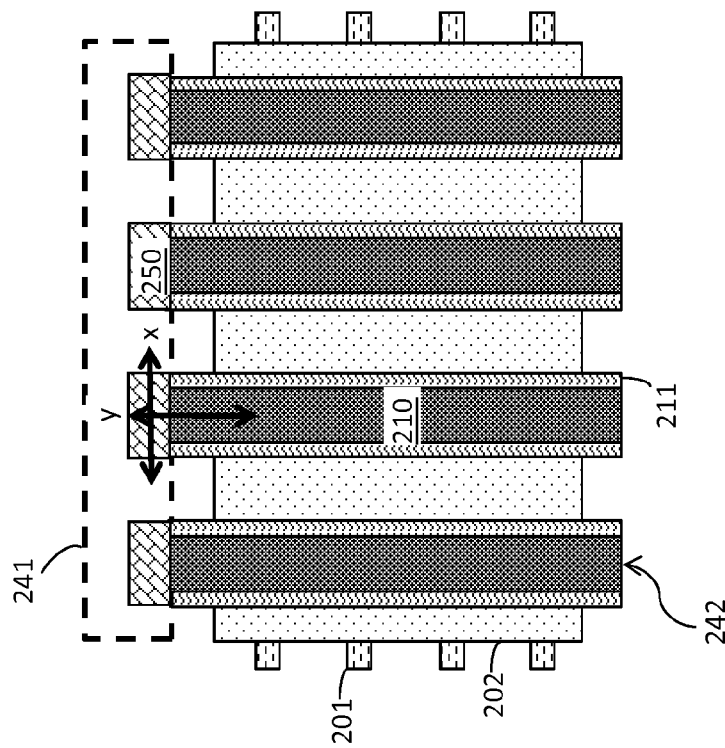

FIGS. 12A-16C illustrate methods of making semiconductor devices according to the second embodiment. FIG. 12A is a top view after etching the gate 242 ends, hard mask 210, spacer 211, and dielectric material layer 212 in the region 241, and depositing a low-k material 250 following FIG. 5A. FIG. 12B is a cross-sectional side view through the x-axis of FIG. 12A. FIG. 12C is a cross-sectional side view through the y-axis of FIG. 12A.

Figure 13B:
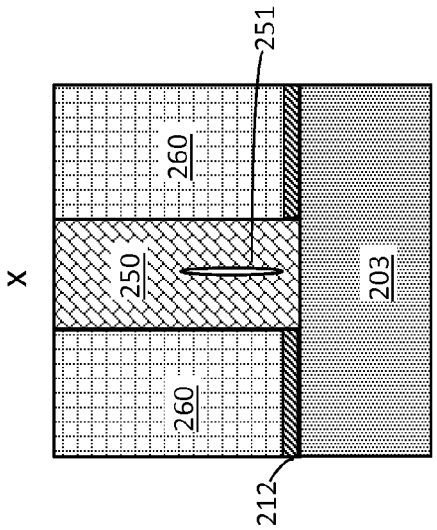
FIG. 13B is a cross-sectional side view through the x-axis of FIG. 13A.
Figure 13C:
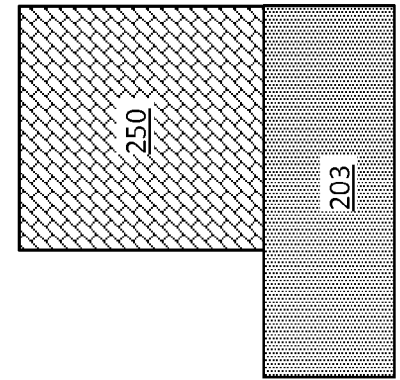
FIG. 13C is a cross-sectional side view through the y-axis of FIG. 13A.
Figure 13A:
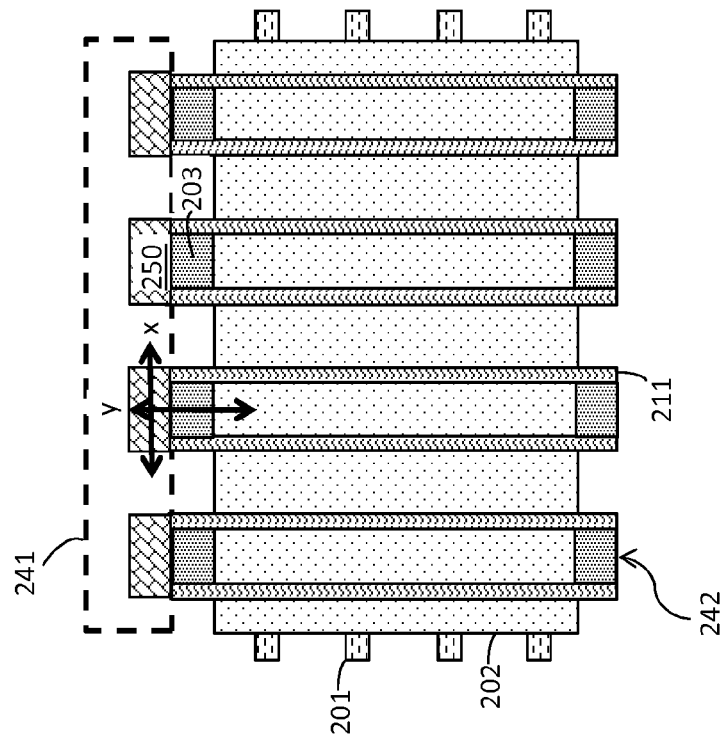
FIG. 13A is a top view after removing the sacrificial gate material.

FIG. 13A is a top view after removing the sacrificial gate material 214 and hard mask 210. FIG. 13B is a cross-sectional side view through the x-axis of FIG. 13A. FIG. 13C is a cross-sectional side view through the y-axis of FIG. 13A.

Instead of recessing the low-k material 250 (FIG. 5B) and depositing the insulating material 252 on the recessed low-k material 250 (FIGS. 6A-6C) as illustrated the first embodiment, the dummy gate (including the sacrificial gate material 214 and hard mask 210) is removed. Methods for removing the sacrificial gate material 214 and hard mask 210 are described in FIGS. 7A-7C.

Figure 14B:
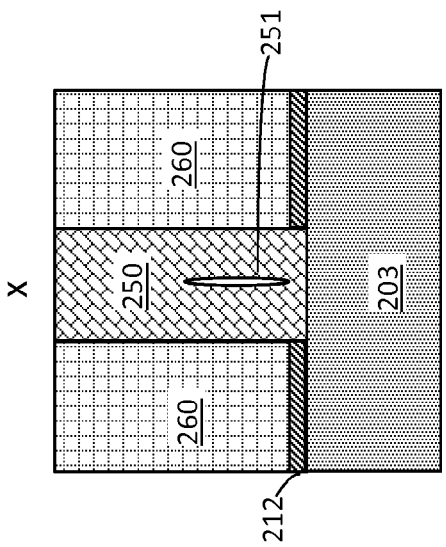
FIG. 14B is a cross-sectional side view through the x-axis of FIG. 14A.
Figure 14C:
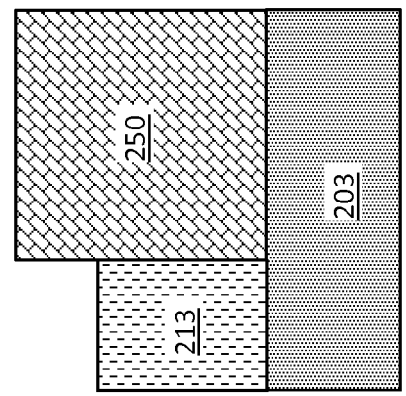
FIG. 14C is a cross-sectional side view through the y-axis of FIG. 14A.
Figure 14A:
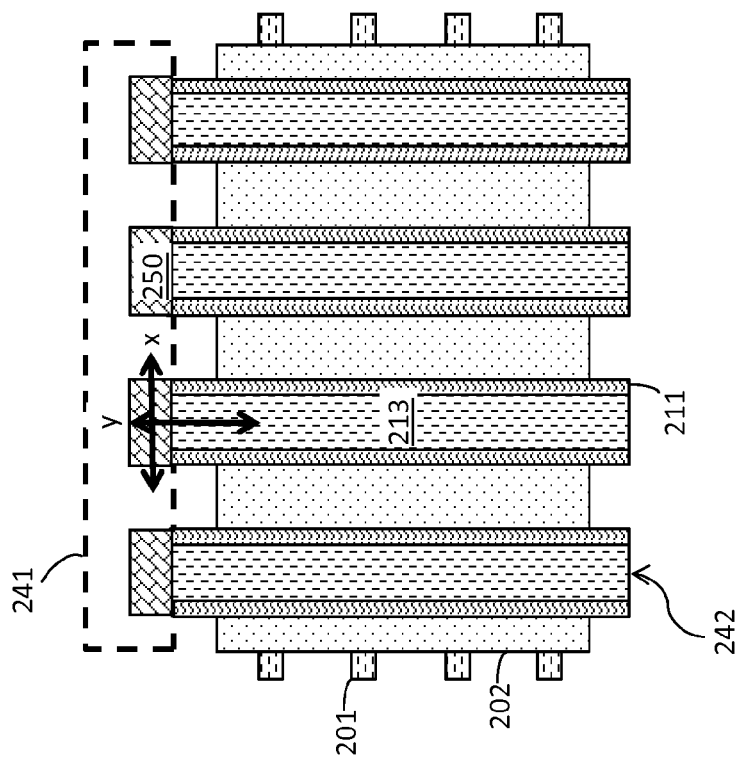
FIG. 14A is a top view after depositing a gate stack and recessing the gate stack.

FIG. 14A is a top view after depositing a gate stack 213 and then recessing the gate stack 213. FIG. 14B is a cross-sectional side view through the x-axis of FIG. 14A. FIG. 14C is a cross-sectional side view through the y-axis of FIG. 14A. Materials and methods for forming and recessing the gate stack 213 are described in FIGS. 8A-9C.

Figure 15B:
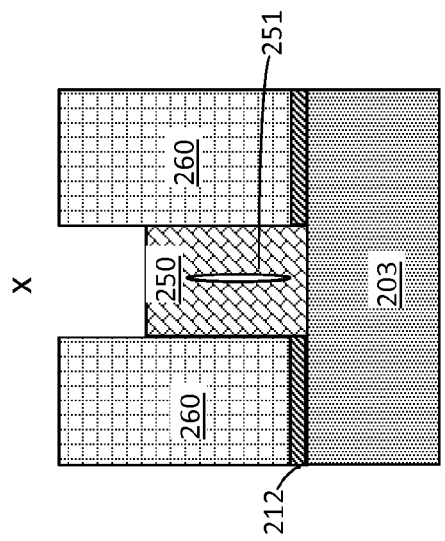
FIG. 15B is a cross-sectional side view through the x-axis of FIG. 15A.
Figure 15C:
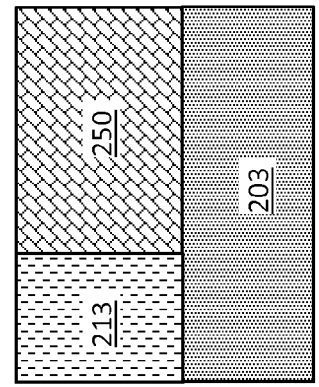
FIG. 15C is a cross-sectional side view through the y-axis of FIG. 15A.
Figure 15A:
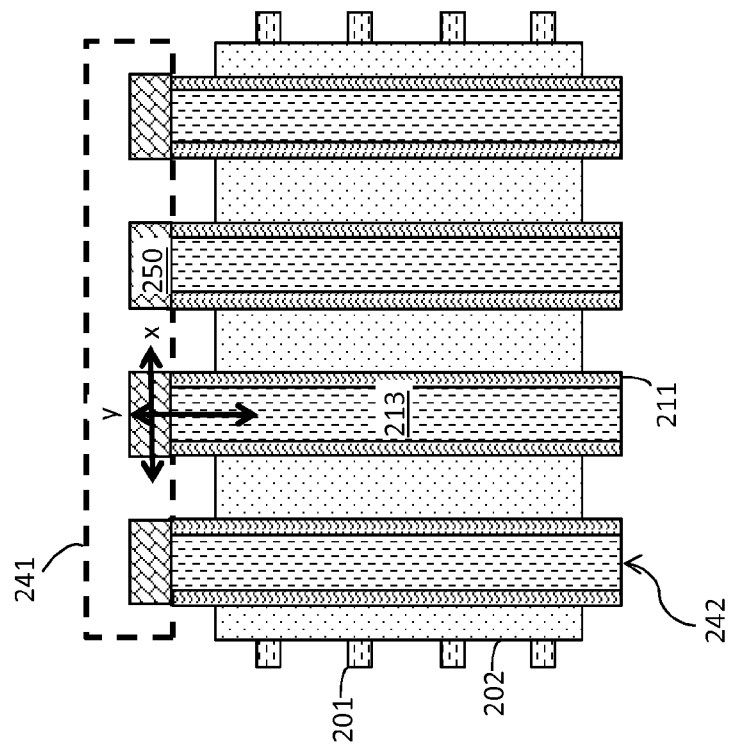
FIG. 15A is a top view after recessing the low-k material.

FIG. 15A is a top view after recessing the low-k material 250. FIG. 15B is a cross-sectional side view through the x-axis of FIG. 15A. FIG. 15C is a cross-sectional side view through the y-axis of FIG. 15A.

The low-k material 250 is recessed down to about the level of the recessed gate stack 213 (FIG. 15C). Methods for recessing the low-k material 250 are described above in FIG. 5B.

Figure 16B:
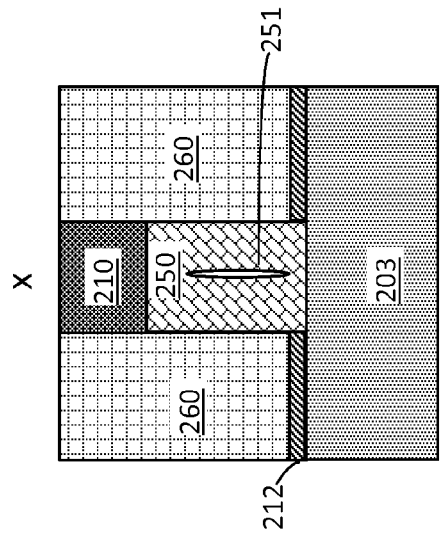
FIG. 16B is a cross-sectional side view through the x-axis of FIG. 16A.
Figure 16C:
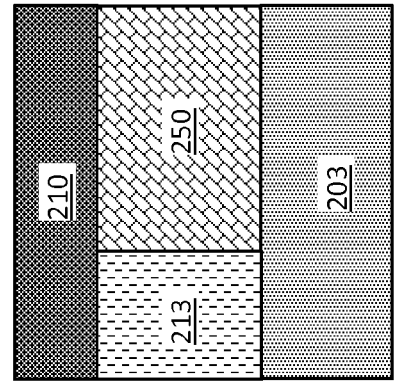
Figure 16A:
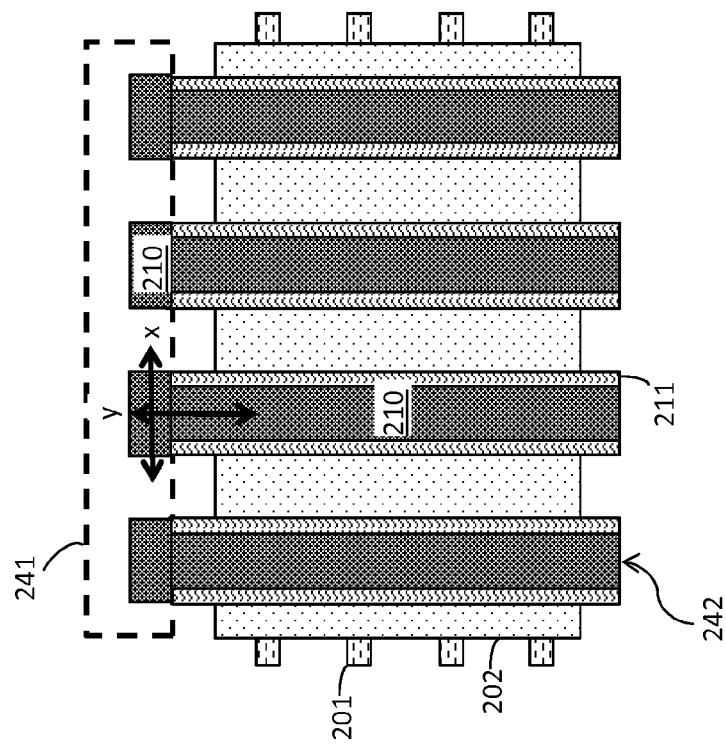
FIG. 16A is a top view after depositing an insulating material on the low-k material and the recessed gate.

FIG. 16A is a top view after depositing an insulating material on the low-k material 250 and the recessed gate stack 213 to form hard masks 210. FIG. 16B is a cross-sectional side view through the x-axis of FIG. 16A. FIG. 16C is a cross-sectional side view through the y-axis of FIG. 16A.

Materials and methods for forming the hard masks 210 are described in FIGS. 6A-6C. In contrast to the first embodiment where the insulating material 252 and hard masks 210 are formed sequentially (FIGS. 6A-6C and FIGS. 10A-10C), respectively), the insulating material forming the hard masks 210 is deposited in a single step (compare FIGS. 10C and 16C).

As described above, various embodiments provide semiconductor devices and methods of making semiconductor devices that reduce the gate end parasitic capacitance. In some embodiments, a low-k material (e.g., less than the k of silicon nitride) is deposited on the gate end to reduce the capacitance, and a silicon nitride cap/layer is deposited on the low-k material to protect the low-k material during process integration. The methods allow for a robust self-aligned contact etching process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
    a substrate comprising an active area;
    a gate disposed on the substrate, a gate spacer positioned on a sidewall of the gate; a gate hard mask positioned on a surface of the gate;
    a bilayer insulating stack disposed on the substrate at an end of the gate, the bilayer insulating stack comprising a low-k material in contact with the substrate and an insulating layer disposed on the low-k material; and
    a source/drain contact positioned on the active area of the substrate and adjacent to the gate.

2. The semiconductor device of claim 1, wherein an air gap is formed in the low-k material.

3. The semiconductor device of claim 1, wherein the insulating layer comprises silicon nitride.

4. The semiconductor device of claim 1, wherein the gate hard mask and the insulating layer comprise silicon nitride.

5. The semiconductor device of claim 1, wherein the low-k material has a k of less than 5.5.

6. The semiconductor device of claim 1, wherein the low-k material is silicon dioxide, spin-on-glass, a flowable oxide, a high density plasma oxide, borophosphosilicate glass (BPSG), SiBN, SiCN, SiBCN, or any combination thereof.

* * * * *